United States Patent
Hamlet et al.

(10) Patent No.: US 12,210,427 B1
(45) Date of Patent: Jan. 28, 2025

(54) METHOD FOR MODIFYING OR VERIFYING A CIRCUIT BY INSERTING A SABOTEUR CIRCUIT

(71) Applicant: National Technology & Engineering Solutions of Sandia, LLC, Albuquerque, NM (US)

(72) Inventors: Jason Hamlet, Albuquerque, NM (US); Tom Mannos, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 16 days.

(21) Appl. No.: 18/139,148

(22) Filed: Apr. 25, 2023

(51) Int. Cl.
*G06F 11/26* (2006.01)
*G06F 11/18* (2006.01)
*G06F 30/327* (2020.01)

(52) U.S. Cl.
CPC .......... *G06F 11/184* (2013.01); *G06F 11/261* (2013.01); *G06F 30/327* (2020.01)

(58) Field of Classification Search
CPC ..... G06F 11/184; G06F 11/261; G06F 30/327
See application file for complete search history.

(56) References Cited

U.S. PATENT DOCUMENTS

| | | | | |
|---|---|---|---|---|
| 6,615,380 B1* | 9/2003 | Kapur | .......... | G06F 11/267 714/739 |
| 8,640,063 B1* | 1/2014 | El-Maleh | .......... | G06F 30/327 716/104 |
| 11,416,662 B1* | 8/2022 | Armato | .......... | G06F 30/3308 |
| 2002/0116683 A1* | 8/2002 | Mitra | .......... | G06F 11/184 714/E11.069 |
| 2009/0300559 A1* | 12/2009 | Baumgartner | .......... | G06F 30/36 716/136 |
| 2012/0239993 A1* | 9/2012 | Chung | .......... | G01R 31/318547 714/E11.054 |
| 2013/0287270 A1* | 10/2013 | Harper | .......... | G06V 10/7788 382/124 |
| 2017/0074932 A1* | 3/2017 | Kourfali | .......... | G06F 30/331 |
| 2020/0050734 A1* | 2/2020 | Schat | .......... | G06F 30/398 |
| 2022/0043059 A1* | 2/2022 | Cruz | .......... | G01R 31/31704 |
| 2022/0414306 A1* | 12/2022 | Strasser | .......... | G01R 31/318314 |

OTHER PUBLICATIONS

Evaluating the Effectiveness of a Diversity TMR Scheme under Neutrons by Tambara published Sep. 2013, 14th European Conference on Radiation and Its Effects on Components and Systems (RADECS) https://ieeexplore.ieee.org/stamp/stamp.jsp?tp=&arnumber=6937382 (Year: 2013).*

(Continued)

*Primary Examiner* — Joseph O Schell
(74) *Attorney, Agent, or Firm* — Mark A. Dodd

(57) ABSTRACT

A method for circuit modification for fault mitigation including: obtaining a netlist defining a circuit; inserting at least one saboteur circuit into a first net of the netlist; configuring an FPGA to implement the first net and the at least one saboteur circuit; activating a first of the at least one saboteur circuits; determining whether the first net experiences a fault; and upon determining that the first net experiences a fault, modifying the first net by inserting at least one redundant circuit into the first net.

10 Claims, 7 Drawing Sheets

(56) References Cited

OTHER PUBLICATIONS

Ebrahimi, M. et al., "A Fast, Flexible, and Easy-to-Develop FPGA-Based Fault Injection Technique," Microelectronics Reliability (2014) 54:1000-1008.
Hamlet, J. R. et al., "Diversity for Microelectronics Lifecycle Security," Sandia Report, SAND2018-11010, Sandia National Laboratories, Sep. 2018, 118 pages.
Mannos, T. J. et al., "Fault Testing a Synthesizable Embedded Processor at Gate Level Using FPGA Emulation," Sandia National Laboratories, SAND2019-0073C, Feb. 20, 2019, 6 pages.
Zuzarte, M., "A Tool For Run Time Soft Error Fault Injection Into FPGA Circuits," Department of Computing and Software, McMaster University, Thesis, Oct. 2014, 104 pages.

\* cited by examiner

METHOD FOR MODIFYING OR VERIFYING A CIRCUIT BY INSERTING A SABOTEUR CIRCUIT

STATEMENT OF GOVERNMENT INTEREST

This invention was made with Government support under Contract No. DE-NA0003525 awarded by the United States Department of Energy/National Nuclear Security Administration. The U.S. Government has certain rights in the invention.

BACKGROUND

Safety and security critical systems require mitigations to ensure critical components continue to operate in the presence of hardware faults. In a general sense, a "fault" is any deviation from the intended circuit behavior. Under this general view, a fault may be naturally occurring, such as from a particle strike or radiation environment, may result from manufacturing defects or circuit degradation over time, may be purposefully injected by an attacker during circuit operation, may result from design errors, maliciously inserted Trojan logic, and so on.

Field programmable gate array (FPGA) circuit emulation and fault injection is currently used in order to detect vulnerable circuits in a netlist. FPGA circuit emulation is a technique that is used to rapidly simulate a circuit on a reprogrammable FPGA. FPGA circuit emulation lends itself to fault injection in order to test the circuit for vulnerabilities. Fault injection may include the introduction of saboteur circuit(s) in order to modify a value or timing characteristic of the circuit being tested. This allows the tester to determine portions of the circuit that are vulnerable to faults.

SUMMARY

According to an embodiment, a method for circuit modification for fault mitigation includes: obtaining a netlist defining a circuit; inserting at least one saboteur circuit into a first net of the netlist; configuring an FPGA to implement the first net and the at least one saboteur circuit; activating a first of the at least one saboteur circuits; determining whether the first net experiences a fault; and upon determining that the first net experiences a fault, modifying the first net by inserting at least one redundant circuit into the first net.

In addition to one or more of the features described herein, or as an alternative, further embodiments may include wherein modifying the first net by inserting at least one redundant circuit into the first net includes: identifying original logic in the first net; inserting at least two redundant logic elements in parallel with the original logic; and providing an output of the original logic and outputs of the at least two redundant logic elements to a majority voter.

In addition to one or more of the features described herein, or as an alternative, further embodiments may include wherein the at least two redundant logic elements includes at least one diverse implementation of the original logic.

In addition to one or more of the features described herein, or as an alternative, further embodiments may include wherein a total number of outputs from the original logic and the at least two redundant logic elements is an odd number.

In addition to one or more of the features described herein, or as an alternative, further embodiments may include wherein determining whether the first net experiences a fault includes determining whether the first net experiences a severe fault.

In addition to one or more of the features described herein, or as an alternative, further embodiments may include determining that the first net includes an untested, second of the at least one saboteur circuits; activating the second of the at least one saboteur circuits; determining whether the first net experiences a second fault; and upon determining that the first net experiences a second fault, modifying the first net by inserting at least one second redundant circuit into the first net.

In addition to one or more of the features described herein, or as an alternative, further embodiments may include determining that the netlist includes a second net without a saboteur circuit; inserting a second saboteur circuit into the second net; configuring the FPGA to implement the second net and the second saboteur circuit; activating the second saboteur circuit; determining whether the second net experiences a fault; upon determining that the second net experiences a fault, modifying the second net by inserting at least one second redundant circuit into the second net.

In addition to one or more of the features described herein, or as an alternative, further embodiments may include obtaining a modified netlist corresponding to the netlist and the at least one redundant circuit; inserting a second saboteur circuit into a first net of the modified netlist; configuring the FPGA to implement the first net of the modified netlist and the second saboteur circuit; activating the second saboteur circuit; testing the first net of the modified netlist; determining whether the first net of the modified netlist passes the testing; upon determining that the first net of the modified netlist passes the testing, retaining the at least one redundant circuit in the modified netlist; and upon determining that the first net of the modified netlist does not pass the testing, removing the at least one redundant circuit from the modified netlist.

According to another embodiment, a system is configured for circuit modification for fault mitigation, the system including a processor; and a memory that stores instructions that, when executed by the processor, cause the processor to perform acts including: obtaining a netlist defining a circuit; inserting a saboteur circuit into a first net of the netlist; configuring an FPGA to implement the first net and the saboteur circuit; activating the saboteur circuit; determining whether the first net experiences a fault; and upon determining that the first net experiences a fault, modifying the first net by inserting at least one redundant circuit into the first net.

According to another embodiment, a computer program is embodied on a computer-readable storage medium, the computer program including instructions for causing a processor to implement a process of circuit modification for fault mitigation, the process including: obtaining a netlist defining a circuit; inserting a saboteur circuit into a first net of the netlist; configuring an FPGA to implement the first net and the saboteur circuit; activating the saboteur circuit; determining whether the first net experiences a fault; and upon determining that the first net experiences a fault, modifying the first net by inserting at least one redundant circuit into the first net.

According to another embodiment, a method for circuit validation includes: obtaining a modified netlist corresponding to a netlist and at least one modification; inserting a saboteur circuit into a first net of the modified netlist; configuring an FPGA to implement the first net of the modified netlist and the saboteur circuit; activating the saboteur circuit; testing the first net of the modified netlist; determining whether the first net of the modified netlist passes the testing; upon determining that the first net of the modified netlist passes the testing, retaining the at least one modification in the modified netlist; and upon determining that the first net of the modified netlist does not pass the testing, removing the at least one modification from the modified netlist.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The present disclosure is illustrated by way of example and not limited in the accompanying figures in which like reference numerals indicate similar elements.

DETAILED DESCRIPTION

Figure 1:
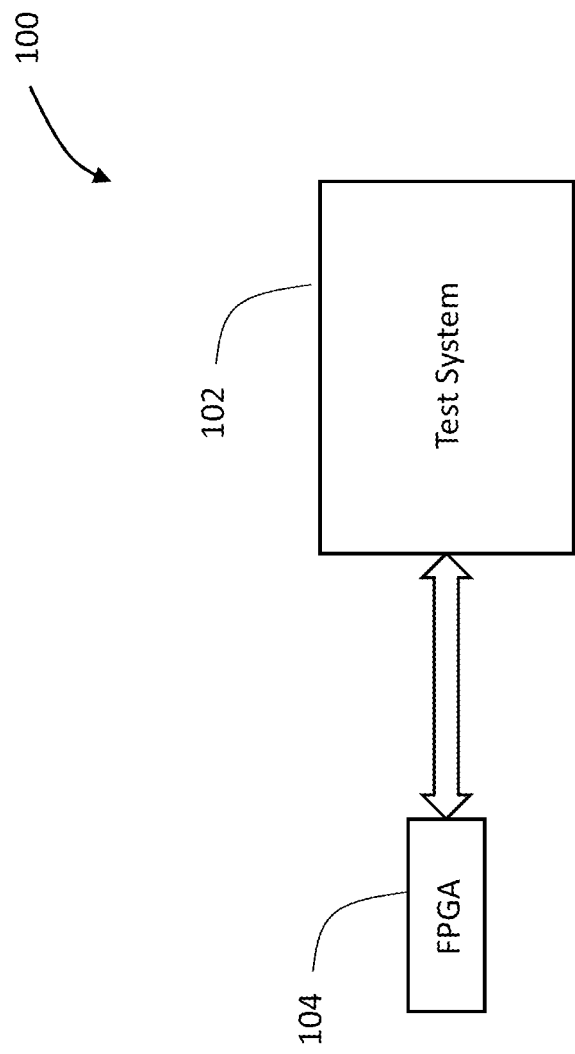
FIG. 1 depicts a system for circuit modification for fault mitigation in an example embodiment.
Figure 7:
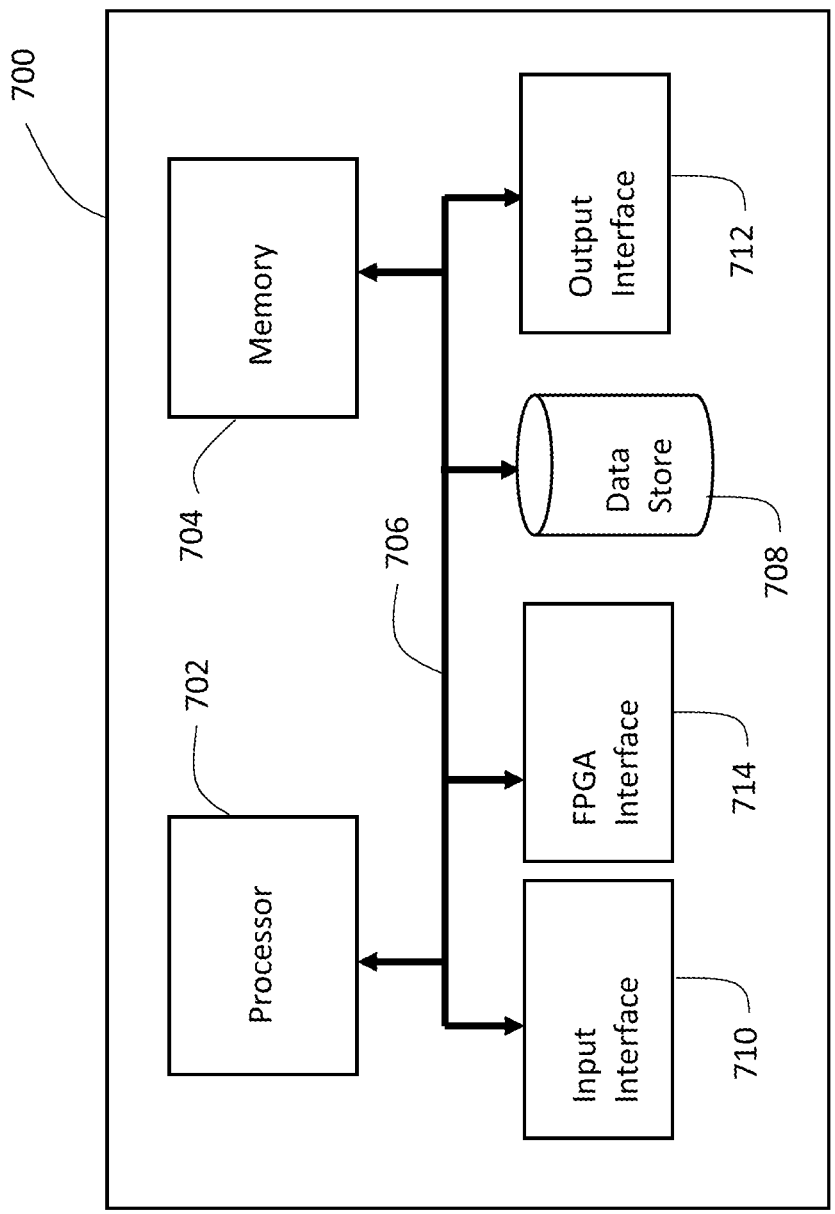
FIG. 7 depicts a computing device in an example embodiment.

FIG. 1 depicts a system 100 for circuit modification for fault mitigation in an example embodiment. The system 100 includes a test system 102 and an FPGA 104 in communication with the test system 102. An example implementation of the test system 102 is depicted in FIG. 7. The test system 102 interfaces with the FPGA 104 to configure the FPGA 104 to implement a circuit under test.

Figure 2:
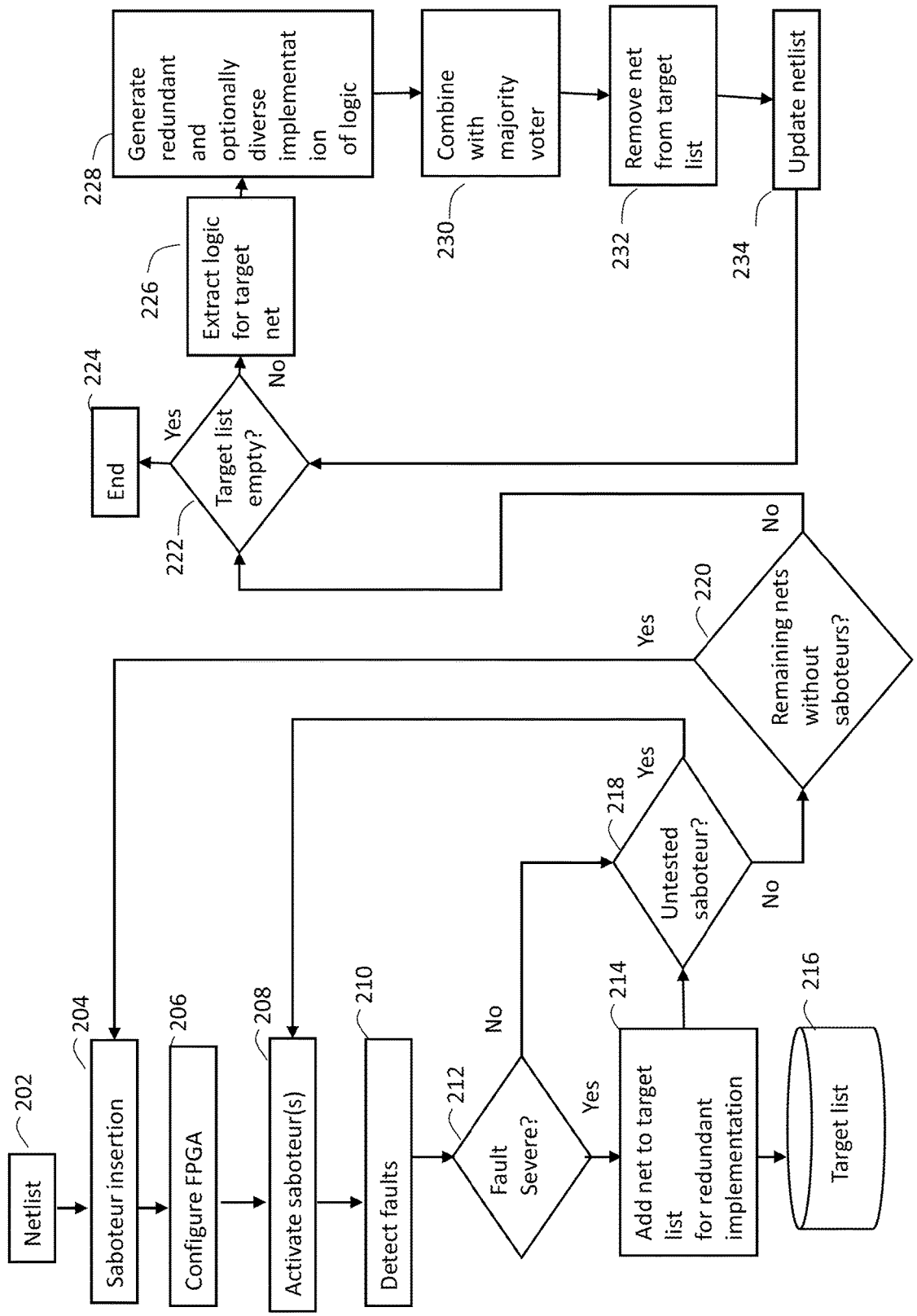
FIG. 2 depicts a process for circuit modification for fault mitigation in an example embodiment.

FIG. 2 depicts a process for circuit modification for fault mitigation in an example embodiment. At 202, the test system 102 obtains a netlist corresponding to a circuit under test. The netlist may be stored in a memory associated with the test system 102. The netlist is a description of the connectivity of the circuit under test and includes a list of all nets in the circuit under test and the connections that nets make between components.

At 204, the test system 102 inserts one or more saboteur circuits into the netlist. If the netlist is large, saboteur circuits may be inserted into a net, or a subset of the nets and the process performed iteratively. The nets selected for saboteur insertion may be selected using the netlist to identify nets prone to faults, based on the circuit configuration.

Figure 3B:
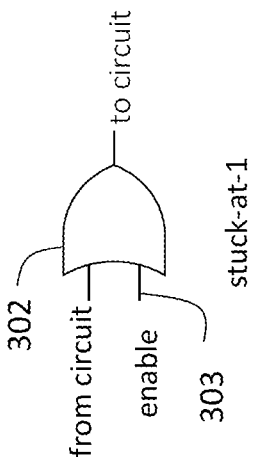
FIGS. 3A-3D depict saboteur circuits in example embodiments.
Figure 3D:
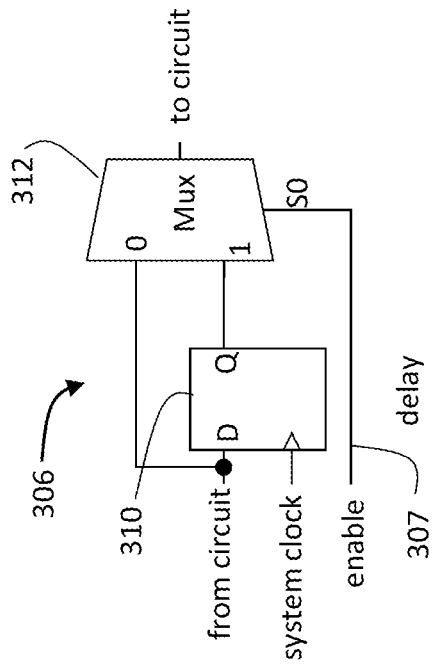
Figure 3A:
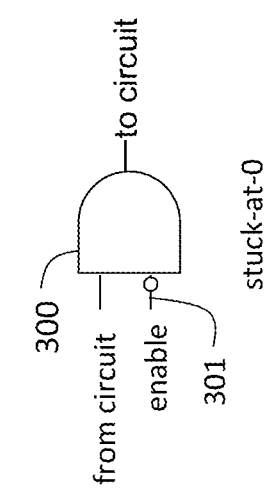
Figure 3C:
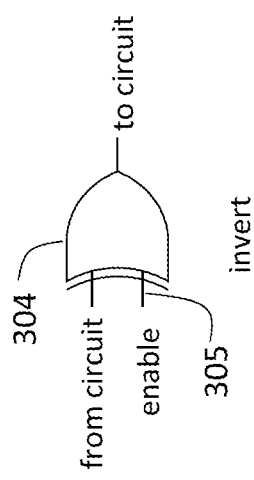

Example saboteur circuits are shown in FIGS. 3A-3D. FIG. 3A depicts a saboteur circuit 300 that modifies a signal to be stuck at zero. The saboteur circuit 300 is activated using an enable signal (e.g., a logic one) applied at an enable input 301. FIG. 3B depicts a saboteur circuit 302 that modifies a signal to be stuck at one. The saboteur circuit 302 is activated using an enable signal (e.g., a logic one) applied at an enable input 303. FIG. 3C depicts a saboteur circuit 304 that modifies a signal to be inverted. The saboteur circuit 304 is activated using an enable signal (e.g., a logic one) applied at an enable input 305. FIG. 3D depicts a saboteur circuit 306 that modifies a signal to be delayed. The saboteur circuit 306 includes a D flip flop 310 that will produce a delayed version of a signal from the original circuit. A multiplexer 312 is used to select either the original signal or the delayed signal from the D flip flop 310. The multiplexer 312 selects the delayed signal used from the D flip flop 306 in response to an enable signal (e.g., a logic one) applied at an enable input 307. The saboteur circuits shown in FIGS. 3A-3D are examples, and embodiments are not limited to the saboteur circuits shown in FIGS. 3A-3D.

Figure 4B:
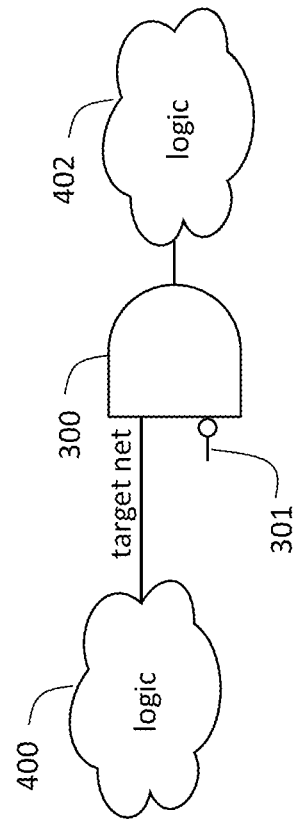
FIGS. 4A-4B depict insertion of a saboteur circuit into a target net in an example embodiment.
Figure 4A:
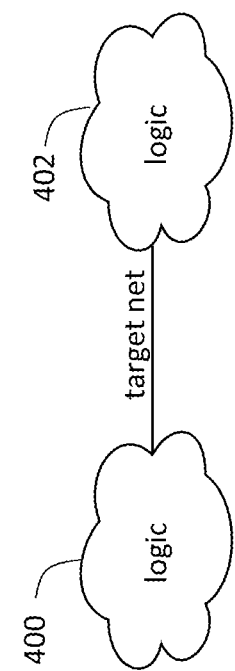

FIGS. 4A-4B depict insertion of a saboteur circuit 300 in a target net in an example embodiment. FIG. 4A depicts a target net, in an original, unmodified state, connecting logic 400 and logic 402. Logic 400 may be referred to as a "from circuit" and logic 402 may be referred to as a "to circuit." When the circuit operates, a signal is sent from logic 400 to logic 402 over the target net. As shown in FIG. 4B, a saboteur circuit 300 is inserted in the target net connecting logic 400 and logic 402. When activated (e.g., the enable signal at enable input 301 is a logic one), the saboteur circuit 300 simulates a stuck at zero condition in the output signal from logic 400. FIG. 4B is one example of saboteur circuit insertion, and embodiments are not limited to use of a single saboteur circuit inserted at a target net.

Referring to FIG. 2, at 206, the test system 102 configures the FPGA 104 with a circuit corresponding to the netlist along with any saboteur circuits. At 208, the test system 102 activates one or more of the saboteur circuits to emulate hardware faults. The saboteur circuits are activated by setting a corresponding enable bit to the proper level (e.g., a logic one).

At 210, the test system 102 evaluates the circuit performance under the fault condition caused by the activated saboteur circuit(s) to detect if any faults occurred in the circuit. At 212, the test system 102 classifies the severity of any faults in the circuit. A fault may be considered severe based on the type of fault and/or the function of the net. The severity of a fault on an individual net is determined by the impact that it has on the overall circuit behavior. For example, if a fault causes a security issue, this fault would be considered severe. If a fault occurs in a net that provides a safety function, this fault would be considered severe. It is understood that other criteria may be used to classify a fault as severe.

At 212, if a fault is considered severe, flow proceeds to 214 where the net(s) that experience a severe fault are added to a target list, depicted at 216. The target list 216 identifies nets that require modification in the form of redundant circuitry.

If at 212, no faults are determined to be severe, flow proceeds to 218 where the test system 102 determines if there are any saboteur circuits that have not been tested (e.g., the enable bit was not set to a logic one). If there remain untested saboteur circuits, flow proceeds to 208 where the untested saboteur circuits are activated and the process repeats. If all the saboteur circuits have been tested at 218, flow proceeds to 220 where the test system 102 determines if there are any remaining nets without saboteur circuits. The test system 102 can also enable arbitrary combinations of saboteur circuits across nets. If so, flow proceeds to 204 and the process repeats to test additional nets.

Once all the saboteur circuits have been activated and there are no remaining nets without saboteur circuits, flow proceeds to 222 where the test system 102 accesses the target list 216 and determines if the target list 216 is empty. If so, the process ends at 224. If at 222 the target list 216 is not empty, flow proceeds to 226.

At 226, the test system 102 extracts original logic corresponding to a net on the target list. The original logic for a net may correspond to a fan-in logic cone for the net, or other arrangement of logic gates.

At 228, the test system 102 generates redundant logic to augment the original logic that experienced a severe fault. For example, if the original logic that experienced a severe fault is an AND gate, the test system 102 may add two or more AND operators in parallel with the original AND gate. The redundant logic may optionally be diverse from the logic that experienced a severe fault. Diverse logic refers to implementing the same logical operation executed by the original logic that experienced a severe fault, but using different logical operators. For example, if the original logic that experienced a severe fault was an OR gate, the redundant logic may be implemented using NAND gates. This diversity in implementation allows the possibility of resilience against common mode failures in addition to transient upsets. There are many ways to automatically generate the diverse variants of the original logic. One approach is to use different universal gate libraries for each variant of the original logic. Another approach involves purposefully changing the internal behavior of the original logic and then adding additional circuitry to recover the intended functionality at the output(s) of the logic. Regardless of how these variants are generated, the original logic and redundant logic are reincorporated into the net. At 230, the net is modified to add a majority voter to process the outputs of the original logic and redundant logic.

Figure 5:
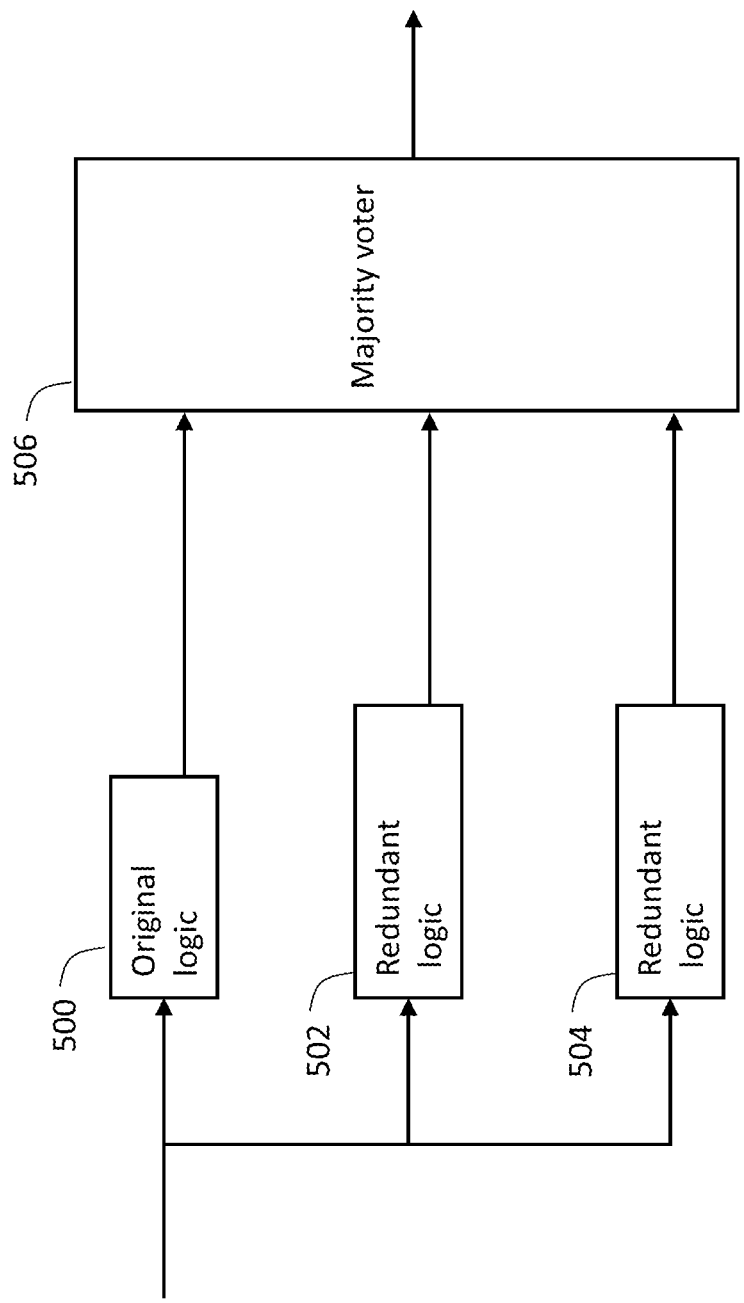
FIG. 5 depicts an example of original logic and redundant logic in an example embodiment.

FIG. 5 depicts an example of original logic and redundant logic. In the example of FIG. 5, the original logic 500 is part of a net that experienced a severe fault upon activation of a saboteur circuit. The test system 102 generates redundant logic 502 and 504 in parallel with the original logic 500. In the example in FIG. 5, two redundant logic elements 502 and 504 are used, but additional redundant logic elements may be used. The total number of outputs from the original logic 500 and any redundant logic is an odd number. The output of the original logic 500 and the outputs of the redundant logic 502 and 504 are provided to a majority voter 506, which outputs a single signal. The redundant logic 502 and 504, along with the majority voter 506, may collectively be termed a redundant circuit. By employing diverse implementations, the original logic 500 and redundant logic 502, 504 will exhibit distinct fault behavior, allowing faults to be mitigated by the majority voter 506. Limiting the introduction of redundant logic to those portions of the net observed to have a severe fault reduces overhead required by triple modular redundant implementations of the complete circuit.

Referring to FIG. 2, once the majority voter is added to the net at 230, flow proceeds to 232 where the net is removed from the target list. The netlist is updated with the redundant logic and majority voter at 234 and the process returns to 222 until all nets on the target list have been modified with redundant logic.

After performing this process for the net (or nets) associated with each of the severe faults, the process can either terminate or restart at the beginning to identify any new severe faults introduced by the (diversely) redundant logic or majority voters.

Figure 6:
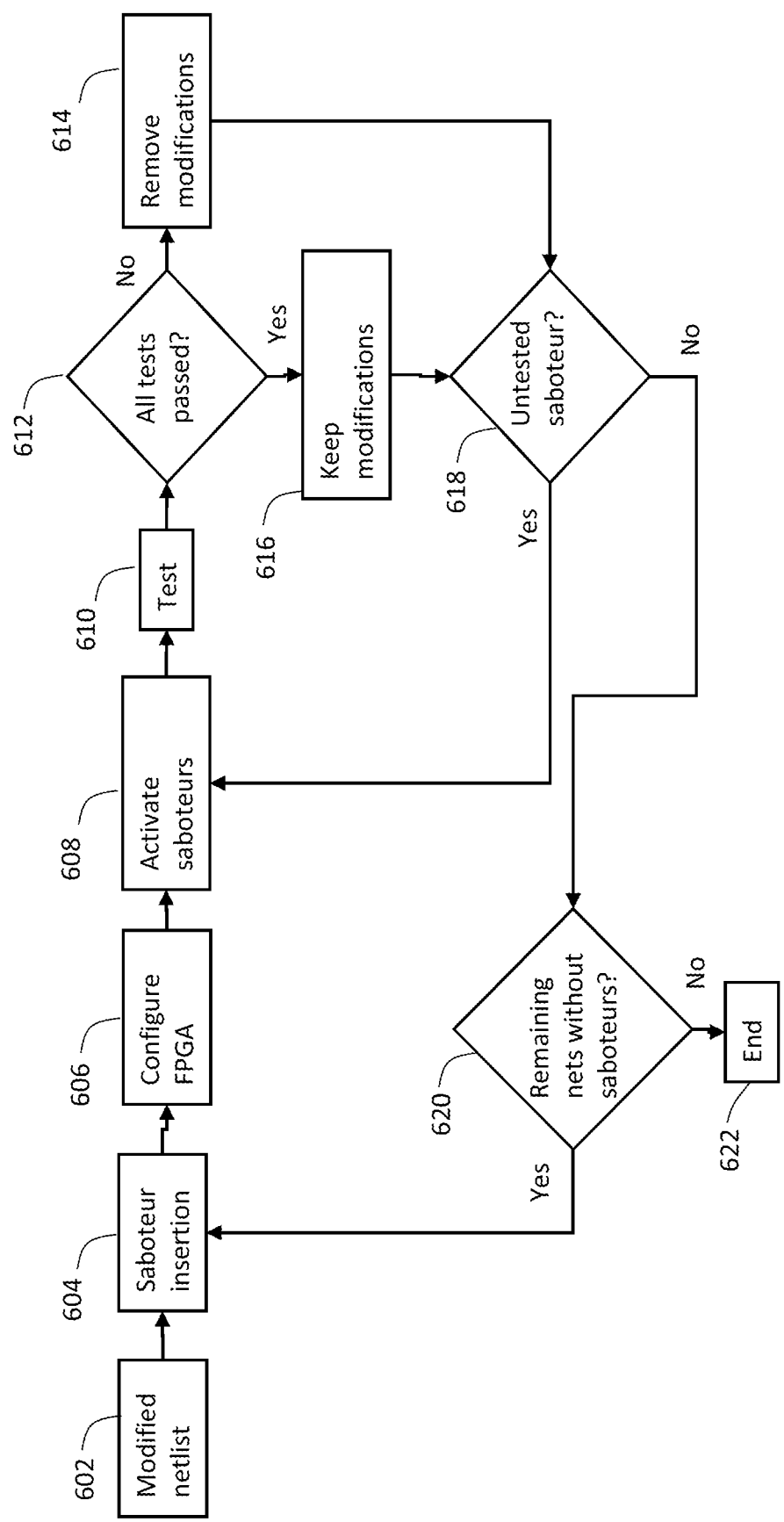
FIG. 6 depicts a process of circuit validation for testing circuit modifications in an example embodiment.

FIG. 6 depicts a process of circuit validation for testing circuit modifications in an example embodiment. The process of FIG. 6 may be used in conjunction with, and subsequent to, the process of FIG. 2. The process of FIG. 6 may also be used as a standalone process for circuit validation.

The original circuit from the initial netlist is modified by adding at least one modification. The modification may include at least one redundant circuit to provide fault mitigation. Alternatively, or in addition, the modification may include at least one circuit for fault detection, e.g., for detecting a hardware Trojan. The combination of the original netlist and the at least one modification is referred to as a modified circuit defined by a modified netlist. The process of FIG. 6 provides for testing of the modified circuit. At 602, the test system 102 obtains a modified netlist. The modified netlist may be stored in a memory associated with the test system 102.

At 604, the test system 102 inserts one or more saboteur circuits into the netlist. If the netlist is large, saboteur circuits may be inserted into a net, or a subset of the nets and the process performed iteratively. The nets selected for saboteur insertion may be selected using the netlist to identify nets prone to faults, based on the circuit configuration.

At 606, the test system 102 configures the FPGA 104 with a circuit corresponding to the modified net along with any saboteur circuits. At 608, the test system 102 activates one or more of the saboteur circuits to emulate hardware faults. The saboteur circuits are activated by setting a corresponding enable bit to the proper level (e.g., a logic one).

At 610, the test system 102 performs a test of the modified circuit. The test at 610 may be all or part of a test suite used to confirm expected behavior of the original circuit, prior to any modifications. At 612, the test system 102 determines if all tests have passed. If so, flow proceeds to 616 where the modifications to the original circuit are retained. At 612, if the test system 102 determines that not all tests have passed, flow proceeds to 614 where the modifications to the original circuit are removed.

From 614 or 616, flow proceeds to 618 where the test system 102 determines if there are any saboteur circuits that have not been tested (e.g., the enable bit was not set to a logic one). If there remain untested saboteur circuits, flow proceeds to 608 where the untested saboteur circuits are activated and the process repeats. If there are no untested saboteur circuits at 618, flow proceeds to 620. At 620, the test system 102 determines if there are any remaining nets without saboteur circuits. If so, flow proceeds to 604 and the process repeats. Once all the saboteur circuits have been activated and there are no remaining nets without saboteur circuits, the process ends at 622.

Referring now to FIG. 7, a high-level illustration of an exemplary computing device 700 that can be used in accordance with the systems and methodologies disclosed herein is illustrated. For instance, the computing device 700 may be used to implement the test system 102 of FIG. 1. The computing device 700 includes at least one processor 702 that executes instructions that are stored in a memory 704. The instructions may be, for instance, instructions for implementing functionality described as being carried out by one or more components discussed above or instructions for implementing one or more of the methods described above. The processor 702 may access the memory 704 by way of a system bus 706. In addition to storing executable instructions, the memory 704 may also store circuit designs, netlists, nets, etc.

The computing device 700 additionally includes a data store 708 that is accessible by the processor 702 by way of the system bus 706. The data store 708 may include executable instructions, circuit designs, netlists, nets, etc. The computing device 700 also includes an input interface 710 that allows external devices to communicate with the computing device 700. For instance, the input interface 710 may be used to receive instructions from an external computer device, from a user, etc. The computing device 700 also includes an output interface 712 that interfaces the computing device 700 with one or more external devices. For example, the computing device 700 may display text, images, etc, by way of the output interface 712. An FPGA interface 714 includes drivers and input/output protocols needed to communicate with the FPGA 104.

It is contemplated that the external devices that communicate with the computing device 700 via the input interface 710 and the output interface 712 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like, and provide output on an output device such as a display. Further, a natural user interface may enable a user to interact with the computing device 700 in a manner free from constraints imposed by input devices such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 700 may be a distributed system. Thus, for instance, several devices may be in communication by way of a network connection and may collectively perform tasks described as being performed by the computing device 700.

As described above, embodiments can be in the form of processor-implemented processes and devices for practicing those processes, such as a processor. Embodiments can also be in the form of computer program code containing instructions embodied in non-transitory tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a non-transitory storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes a device for practicing the embodiments. When implemented on a general-purpose microprocessor, the computer program code segments configure the microprocessor to create specific logic circuits.

The terminology used herein is for the purpose of describing particular embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method for circuit modification for fault mitigation, the method comprising:
   obtaining a netlist defining a circuit;
   inserting at least one saboteur circuit into a first net of the netlist;
   configuring an FPGA to implement the first net and the at least one saboteur circuit;
   activating a first of the at least one saboteur circuits;
   determining whether the first net experiences a fault;
   upon determining that the first net experiences a fault, modifying the first net by inserting at least one redundant circuit into the first net;
   obtaining a modified netlist corresponding to the netlist and the at least one redundant circuit;
   inserting a second saboteur circuit into a first net of the modified netlist;
   configuring the FPGA to implement the first net of the modified netlist and the second saboteur circuit;
   activating the second saboteur circuit;
   testing the first net of the modified netlist;
   determining whether the first net of the modified netlist passes the testing;
   upon determining that the first net of the modified netlist passes the testing, retaining the at least one redundant circuit in the modified netlist; and
   upon determining that the first net of the modified netlist does not pass the testing, removing the at least one redundant circuit from the modified netlist.

2. The method of claim 1 wherein modifying the first net by inserting at least one redundant circuit into the first net comprises:
   identifying original logic in the first net;
   inserting at least two redundant logic elements in parallel with the original logic; and
   providing an output of the original logic and outputs of the at least two redundant logic elements to a majority voter.

3. The method of claim 2 wherein the at least two redundant logic elements includes at least one diverse implementation of the original logic.

4. The method of claim 2 wherein a total number of outputs from the original logic and the at least two redundant logic elements is an odd number.

5. The method of claim 1 wherein determining whether the first net experiences a fault comprises determining whether the first net experiences a severe fault.

6. The method of claim 1 further comprising:
    determining that the first net includes an untested, second of the at least one saboteur circuits;
    activating the second of the at least one saboteur circuits;
    determining whether the first net experiences a second fault; and
    upon determining that the first net experiences a second fault, modifying the first net by inserting at least one second redundant circuit into the first net.

7. The method of claim 1 further comprising:
    determining that the netlist includes a second net without a saboteur circuit;
    inserting a second saboteur circuit into the second net;
    configuring the FPGA to implement the second net and the second saboteur circuit;
    activating the second saboteur circuit;
    determining whether the second net experiences a fault; and
    upon determining that the second net experiences a fault, modifying the second net by inserting at least one second redundant circuit into the second net.

8. A system that is configured for circuit modification for fault mitigation, the system comprising:
    a processor; and
    a memory that stores instructions that, when executed by the processor, causes the processor to perform acts comprising:
        obtaining a netlist defining a circuit;
        inserting a saboteur circuit into a first net of the netlist;
        configuring an FPGA to implement the first net and the saboteur circuit;
        activating the saboteur circuit;
        determining whether the first net experiences a fault;
        upon determining that the first net experiences a fault, modifying the first net by inserting at least one redundant circuit into the first net;
        obtaining a modified netlist corresponding to the netlist and the at least one redundant circuit;
        inserting a second saboteur circuit into a first net of the modified netlist;
        configuring the FPGA to implement the first net of the modified netlist and the second saboteur circuit;
        activating the second saboteur circuit;
        testing the first net of the modified netlist;
        determining whether the first net of the modified netlist passes the testing;
        upon determining that the first net of the modified netlist passes the testing, retaining the at least one redundant circuit in the modified netlist; and
        upon determining that the first net of the modified netlist does not pass the testing, removing the at least one redundant circuit from the modified netlist.

9. A computer program comprising a computer-readable non-transitory storage medium, the computer program including instructions for causing a processor to implement a process of circuit modification for fault mitigation, the process comprising:
    obtaining a netlist defining a circuit;
    inserting a saboteur circuit into a first net of the netlist;
    configuring an FPGA to implement the first net and the saboteur circuit;
    activating the saboteur circuit;
    determining whether the first net experiences a fault;
    upon determining that the first net experiences a fault, modifying the first net by inserting at least one redundant circuit into the first net;
    obtaining a modified netlist corresponding to the netlist and the at least one redundant circuit;
    inserting a second saboteur circuit into a first net of the modified netlist;
    configuring the FPGA to implement the first net of the modified netlist and the second saboteur circuit;
    activating the second saboteur circuit;
    testing the first net of the modified netlist;
    determining whether the first net of the modified netlist passes the testing;
    upon determining that the first net of the modified netlist passes the testing, retaining the at least one redundant circuit in the modified netlist; and
    upon determining that the first net of the modified netlist does not pass the testing, removing the at least one redundant circuit from the modified netlist.

10. A method for circuit validation, the method comprising:
    obtaining a modified netlist corresponding to a netlist and at least one modification;
    inserting a saboteur circuit into a first net of the modified netlist;
    configuring an FPGA to implement the first net of the modified netlist and the saboteur circuit;
    activating the saboteur circuit;
    testing the first net of the modified netlist;
    determining whether the first net of the modified netlist passes the testing;
    upon determining that the first net of the modified netlist passes the testing, retaining the at least one modification in the modified netlist; and
    upon determining that the first net of the modified netlist does not pass the testing, removing the at least one modification from the modified netlist.

* * * * *